(12) United States Patent
Yang et al.

(10) Patent No.: US 7,554,111 B2
(45) Date of Patent: Jun. 30, 2009

(54) NANOPARTICLE-POLYMER BISTABLE DEVICES

(75) Inventors: Yang Yang, Los Angeles, CA (US); Richard Kaner, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 311 days.

(21) Appl. No.: 11/131,980

(22) Filed: May 18, 2005

(65) Prior Publication Data
US 2005/0270442 A1 Dec. 8, 2005

Related U.S. Application Data

(60) Provisional application No. 60/573,304, filed on May 20, 2004.

(51) Int. Cl.
*H01L 35/24* (2006.01)
(52) U.S. Cl. .......... 257/40; 257/E51.011; 257/E51.028; 365/151; 365/153; 977/810; 977/897; 977/943
(58) Field of Classification Search .......... 257/40, 257/E51.011, E51.028; 365/151, 153; 977/810, 977/897, 943
See application file for complete search history.

(56) References Cited

U.S. PATENT DOCUMENTS

| | | | |
|---|---|---|---|
| 3,719,933 | A | 3/1973 | Wakabayashi et al. |
| 3,833,894 | A | 9/1974 | Aviram et al. |
| 4,144,418 | A | 3/1979 | Girard et al. |
| 4,371,883 | A | 2/1983 | Potember et al. |
| 4,507,672 | A | 3/1985 | Potember et al. |
| 4,652,894 | A | 3/1987 | Potember et al. |
| 4,663,270 | A | 5/1987 | Potember et al. |
| 4,987,023 | A | 1/1991 | Sato et al. |
| 5,075,738 | A | 12/1991 | Matsuda et al. |
| 5,136,212 | A | 8/1992 | Eguchi et al. |
| 5,238,607 | A | 8/1993 | Herron et al. |
| 5,543,631 | A | 8/1996 | Weinberger |
| 5,563,424 | A | 10/1996 | Yang et al. |
| 5,569,565 | A | 10/1996 | Kawakami et al. |
| 5,610,898 | A | 3/1997 | Takimoto et al. |

(Continued)

FOREIGN PATENT DOCUMENTS

WO    WO 01/71814 A1    9/2001

(Continued)

OTHER PUBLICATIONS

Smith et al., Gold-polyaniline composite, Phys. Chem. Chem. Phys., 2005, 7, 3614-3618.*

(Continued)

*Primary Examiner*—Anh Phung
*Assistant Examiner*—Michael Lulis
(74) *Attorney, Agent, or Firm*—Venable LLP; Henry J. Daley

(57) ABSTRACT

A bistable electrical device employing a bistable polymer body made from an electrically insulating polymer material in which doped nanofibers are dispersed. The doped nanofibers are composed of an electrically conductive nanofiber material and electrically conductive nanoparticles. The doped nanofibers impart bistable electrical characteristics to the polymer body, such that the polymer body is reversibly convertible between a low resistance state and a high resistance state by application of an electrical voltage.

11 Claims, 4 Drawing Sheets

U.S. PATENT DOCUMENTS

| | | | |
|---|---|---|---|
| 5,761,115 | A | 6/1998 | Kozicki et al. |
| 6,015,631 | A | 1/2000 | Park |
| 6,055,180 | A | 4/2000 | Gudesen et al. |
| 6,122,031 | A | 9/2000 | Terada et al. |
| 6,208,553 | B1 | 3/2001 | Gryko et al. |
| 6,229,047 | B1 | 5/2001 | Glaser et al. |
| 6,600,473 | B1 | 7/2003 | Kobayashi et al. |
| 6,631,085 | B2 | 10/2003 | Kleveland et al. |
| 6,774,880 | B2 | 8/2004 | Kobayashi |
| 6,828,685 | B2 | 12/2004 | Stasiak |
| 6,852,555 | B1 | 2/2005 | Roman et al. |
| 6,950,331 | B2 | 9/2005 | Yang et al. |
| 6,982,514 | B1 * | 1/2006 | Lu et al. ............... 310/300 |
| 2002/0010261 | A1 * | 1/2002 | Callahan et al. ........ 524/832 |
| 2002/0031602 | A1 | 3/2002 | Zhang |
| 2002/0163828 | A1 | 11/2002 | Krieger et al. |
| 2002/0163831 | A1 | 11/2002 | Krieger et al. |
| 2002/0195600 | A1 | 12/2002 | Leuschner |
| 2003/0053350 | A1 | 3/2003 | Krieger et al. |
| 2003/0063362 | A1 | 4/2003 | Demir et al. |
| 2003/0155602 | A1 | 8/2003 | Krieger et al. |
| 2003/0173612 | A1 | 9/2003 | Krieger et al. |
| 2003/0178667 | A1 | 9/2003 | Krieger et al. |
| 2003/0179633 | A1 | 9/2003 | Krieger et al. |
| 2004/0026714 | A1 | 2/2004 | Krieger et al. |
| 2004/0159835 | A1 | 8/2004 | Krieger et al. |
| 2004/0160801 | A1 | 8/2004 | Krieger et al. |
| 2004/0246768 | A1 | 12/2004 | Krieger et al. |
| 2005/0111071 | A1 | 5/2005 | Kojima et al. |

FOREIGN PATENT DOCUMENTS

| | | | |
|---|---|---|---|
| WO | WO 02/37500 | * | 5/2002 |
| WO | WO 02/091496 A2 | | 11/2002 |
| WO | WO 2004/064074 | | 7/2004 |

OTHER PUBLICATIONS

Tseng et al. Polyaniline Nanofiber/Gold Nanoparticle Nonvolatile Memory, Nano Letters, 2005, vol. 5, No. 6, 1077-1080.*

Tseng et al., Charge transfer effect in the polyaniline-gold nanoparticle memory system, Appl. Phys. Lett., 2007, 90, 053101.*

Burroughes, J.H., Bradley, D.D.C., Brown, A.R., Marks, R.N., Mackay, K., Friend, R.H., Burns, P.L. & Holmes, A.B. Light-emitting diodes based on conjugated polymers. Nature 347, 539-541 (1990).

Wendy U. Huynh, Janke J. Dittmer, A Paul Alivisatos, Science, 295, 2425 (2002).

S. Scheinert, G. Paasch, M. Schrodner, H.K. Roth, S. Sensfub, and Th. Doll, J. Appl. Phys., 92, 300 (2002).

L. Ma, J. Liu, Y. Yang, Appl. Phys. Lett., 80, 2997 (2002). "Organic electrical bistable devices and rewritable memory cells".

L. Ma, S. Pyo, J. Ouyang, Q. Xu, Y. Yang, Appl. Phys. Lett. 82, 1419 (2003). "Noavolatile electrical bistability of organic/metal-nanocluster/organic system."

J. C. Chiang, A.G. MacDiarmid, Synth. Met., 13, 193 (1986), "Polyaniline: Protonic acid doping of the emeraldine form to the metallic regime."

Jiaxing Huang, Shabnam Virji, Bruce H. Weiller, and Richard B. Kaner, J. Am Chem Soc, 25, 314 (2003). "Polianiline ANanofiibers: Facile Synthesis and Chemical Sensors."

Shabnam Virji, Jiaxing Huang, Richard B. Kaner, and Bruce H. Weiller, Nano Lett., 4, 491 (2004). "Pollyaniline Nanofiber Gas Sensors: Examiner of Response Mechanisms".

Jiaxing Huang, Richard B. Kaner, J. Am. Chem. Soc. 126, 851 (2004). "A General Chemical Route to Polyaniline Nanofibers".

T. Furukawa, Adv. Colloid Interface Sci., 71-72, 183 (1997). "Structure and functional properties of ferroelectric polymer."

Tsuyoshi Tsujioka and Kazuya Masuda, Appl. Phys. Lett. 83, 4978 (2003). "Electrical carrier-injection and transport characteristics of photochromic diarylethene films".

M.A. Reed, J. Chen, A. M. Rawlett, D. W. Price, and J. M. Tour, Appl. Phys. Lett, 78, 3735 (2001). "Molecular random access memory cell ".

Yong Chen, Douglas A.A. Ohlberg, Xuema Li, Duncan R. Stewart, R. Stanley Williams, Jan O. Jeppesen, Kent A. Nielsen, J. Fraser Stoddart, Deirdre L. Olynick, Erik Anderson, Appl. Phys. Lett. 82, 1610 (2003). "Nanoscale molecular-switch devices fabricated by imprint lithography".

The Electrochemical Society—Current Affairs—Abstracts of "Recent News" Papers, Presented at Electronics Division Semiconductor Symposia, Los Angeles, CA (1962).

Ovshinsky, S.R., "Localized States in the Gap of Amorphous Semiconductors", Phys. Rev. Lett., vol. 36 (No. 24), Jun. 14, 1976, p. 1469-1472.

Y. G. Kriger, N.F. Yudanov, I.K. Igumenov, and S.B. Vashchenko, J. Struct. Chem. 34, 966 (1993).

Hovel, H.J. and J.J. Urgell, "Switching and Memory Characteristics of ZnSe—Ge Heterojunctions", J. Appl. Phys. 42, 5076 (1971).

Kumai, R., Y. Okimoto and Y. Tokura, "Current-Induced Insulator-Metal Transition and Pattern Formation in an Organic Charge-Transfer Complex", Science 284, 1645 (1999).

Garnier, F., R. Hajlaoui, A. Yassar and P. Shirakawa, "All-Polymer Field-Effect Transistor Realized by Printing Techniques", Science 265, 1684 (1994).

Hide, F., M.A. Diaz-Garcia, B.J. Schwartz, M.R.A. Andersson, Q. Pei and A.J. Heeger, Science 273, 1833 (1996).

Fujita, W. and K. Awaga, "Room-Temperature Magnetic Bistability in Organic Radical Crystals", Science, vol. 286 p. 261 (1999).

Burroughes, J.H., D.D.C. Bradley, A.R. Brown, R.N. Marks, K. Mackay, R.H. Friend, P.L. Burn and A.B. Holmes, "Light-Emitting Diodes Based on Conjugated Polymers", Nature, vol. 347, p. 539 (1990).

Yamada, T., D. Zou, H. Jeong, Y. Akaki and T. Tsutsui, "Recoverable Degradation and Internal Field Forming Process Accompanied by the Orientation of Dipoles in Organic Light Emitting Diodes", Synthetic Metals, 111-112, 237 (2000).

Liu, J., Y. Shi, L.P. Ma and Y. Yang, "Device Performance and Polymer Morphology in Polymer Light Emitting Diodes: The Control of Device Electrical Properties and Metal/Polymer Contact", J. Appl. Phys. 88, 605 (2000).

Hamada, Y., C. Adachi, T. Tsutsui and S. Saito, "Blue-Light-Emitting Organic Electroluminescent Devices with Oxadiazole Dimer Dyes as an Emitter", Jpn. J. Appl. Phys. 31, 1812 (1992).

Silva, et al., Bistable Switching and Memory Devices; Journal of non-Crystalline Solids; (1970) oo, 316-333 No. Holland Publishing Co., Amsterdam.

Bozano, et al; Mechanism for Bistability in Organic Memory Elements; Applied Physics Letters, (2004); vol. 84, No. 4, pp. 607-609; 2004 American Institute of Physics.

Hua, et al.; New Organic Bistable Films for Ultrafast Electric Memories; Applied Surface Science, 169-170 (20010 pp. 447-451,Elsevier Science B.V.

Beinhoff, et al., Poybiphenymethylenes: New Polymers for Bistable Organic Switches; Polymeric Materials: Science and Engineering 90, (2004) 211, 212, U.S.

Sezi, et al.; Organic Materials for High-Density NonVolatile Memory Applications; Proc. IEEE Int. Elec. Dev. Meeting; (2003); Germany.

Kevorkian, et al.; bistable Switching in Organic Thin Films; Discussions of the Faraday Society, 51, (1971) pp. 139-142; U.S.

Pei, Qibing et al., Polymer Light-Emitting Electrochemical Cells, Science, New Series, vol. 269, No. 5227 (Aug. 25, 1995), pp. 1086-1088.

Kolega et al., Langmiur 1998, vol. 14, p. 5469-5478.

Schlaf et al., "Photoemission Spectrocscopy of LiF Coated Al and Pt Electrodes", Journal of Applied Physics, vol. 84, No. 12, pp. 6729-6736.

Beeler, F., O.K. Andersen and M. Scheffler, Theoretical Evidence for Low-Spin Ground States of Early Interstitial and Late Substitutional 3d Transition-Metal Ions in Silicon, Phys. Rew. Lett. 55, 1498 (1985).

Boyd, G.D., J. Cheng and P.D.T. Ngo, "Liquid-Crystal Orientational Bistability and Nematic Storage Effects", Appl. Phys., Lett. 36, 556 (1980).

Brown, W.D. and J.E. Brewer, "Nonvolatile Semiconductor Memory Technology", IEEE Press, New York (1998).

Chen, J., W. Wang, M.A. Reed, A.M. Rawlett, D.W. Price and J.M. Tour, "Room-Temperature Negative Differential Resistance in Nanoscale Molecular Junctions", Appl. Phys. Lett. 77, 1224 (2000).

Dewald, J.F., A.D. Pearson, W.R. Northover and W.F. Peck, Jr., "Semi-Conducting Glasses", Electrochem. Soc., 109, 243c (1962).

Faltermeier, C., C. Goldberg, M. Jones, A. Upham, D. Manger, G. Peterson, J. Lau, A.E. Kaloyeros, B. Arkles, and A. Paranjpe, "Barrier Properties of Titanium Nitride Films Grown by Low Temperature Chemical Vapor Deposition from Titanium Tetraoidide", J. Electrochemical Society, 144, 1002 (1997).

Gruler, H. and L. Cheung, "Dielectric Alignment in an Electrically Conducting Nematic Liquid Crystal", J. Appl. Phys. 46, 5097 (1975).

Istratov, A.A. and E.R. Weber, "Physics of Copper in Silicon", J. Electrochemical Society, 149, G21 (2002).

Istratov, A.A., C. Flink, H. Hieslmair, E.R. Weber and T. Heiser, "Intrinsic Diffusion Coefficient of Interstitial Copper in Silicon", Phys. Rev. Lett. 81, 1243 (1998).

Istratov, A.A., C. Flink, H. Hieslmair, S.A. Mchugo and E.R. Weber, "Diffusion, Solubility and Gettering of Copper in Silicon", Materials Science and Engineering Technology B, 72, 99 (2000).

Kaloyeros, A.E. and E. Eisenbraun, "Ultrathin Diffusion Barriers/Liners for Gigascale Copper Metallization", Annual Rev. Materials Science, 30, 363 (2000).

Krishnamoorthy, A., K. Chanda, S.P. Murarka, G. Ramanath and J.G. Ryan, "Self-Assembled Near-Zero-Thickness Molecular Layers as Diffusion Barriers for Cu Metallization", Appl. Phys. Lett. 78, 2467 (2001).

Lane, M.W., E.G. Liniger and J.R. Lioyd, "Relationship Between Interfacial Adhesion and Electromigration in Cu Metallization", J. Appl. Phys. 93, 1417 (2003).

Lee, K.L., C.K. Hu and K.N. Tu, "In-Situ Scanning Electron Microscope Comparison Studies on Electromigration of Cu and Cu(Sn) Alloys for Advanced Chip Interconnects", J. Appl. Phys. 78, 4428-4437 (1995).

Loke, A.L.S., J.T. Wetzel, P.H. Townsend, T. Tanabe, R.N. Vrtis, M.P. Zussman, D. Kumar, C. Ryu and S.S. Wong, "Kinetics of Copper Drift in Low-Kappa Polymer Interlevel Dielectrics", IEEE Transactions on Electron Devices 46, 2178 (1999).

Ma, L.P., J. Liu, S.M. Pyo and Y. Yang, "Organic Bistable Light-Emitting Devices", Appl. Phys. Lett. 80, 362 (2002).

Ma, L.P., J. Liu, S.M. Pyo, Q.F. Xu and Y. Yang, "Organic Bistable Devices", Mol. Cryst. Liq. Cryst. 378, 185 (2002).

Ma, L.P., W.J. Yang, S.S. Xie and S.J. Pang, "Ultrahigh Density Data Storage from Local Polymerization by a Scanning Tunneling Microscope", Appl. Phys. Lett. 73, 3303 (1998).

McBrayer, J.D., R.M. Swanson and T.W. Sigmon, "Diffusion of Metals in Silicon Dioxide", J. Electrochem. Soc. 133, 1242 (1986).

Nakayama, K., K. Kojima, Y. Imai, T. Kasai, S. Fukushima, A. Kitagawa, M. Kumeda, Y. Kakimoto and M. Suzuki, "Nonvolatile Memory Based on Phase Change in Se-Sb-Te Glass", J. J. Appl. Phys., Part 1, 42 (2A), 404 (2003).

Ostraat, M.L., J.W. De Blauwe, M.L. Green, L.D. Bell, M.L. Brongerma, J.R. Casperson, C. Flagan and H.A. Atwater, , "Synthesis and Characterization of Aerosol Silicon Nanocrystal Nonvolatile Floating-Gate Memory Devices", Appl. Phys. Lett. 79, 433 (2001).

Patel, J.S., "Room-Temperature Switching Behavior of Ferroelectric Liquid Crystals in Thin Cells," Appl. Phys. Lett. 47, 1277 (1985).

Potember, R.S., T.O. Poehler and D.O. Cowan, "Electrical Switching and Memory Phenomena in Cu-TCNQ Thin Films", Appl. Phys. Lett. 34, 405 (1979).

Rosenberg, R., D.C. Edelstein, C.K. Hu, and K.P. Rodbell, "Copper Metallization for High Performance Silicon Technology", Annual Rev. Materials Science, 30, 229 (2000).

Segui, Y., Ai Bui and H. Carchano, "Switching in Polystyrene Films: Transition from On to Off State", J. Appl. Phys. 47, 140 (1976).

Sprang, H.A. van, and J.L. M. van de Venne, "Influence of the Surface Interaction on Threshold Values in the Cholestericnematic Phase Transition", J. Appl. Phys. 57, 175 (1985).

Wang, M.T., Y.C. Lin, and M.C. Chen, "Barrier Properties of Very Thin Ta and TaN layers Against Copper Diffusion", J. Electrochemical Society, 145, 2538 (1998).

Yang, K.H., T.C. Chieu and S. Osofsky, "Depolarization Field and Ionic Effects on the Bistability of Surface-Stabilized Ferroelectric Liquid-Crystal Devices", Appl. Phys. Lett. 55, 125 (1989).

K. Takimoto, H. Kawade, E. Kishi, K. Yano, K, Sakai, K. Hatanaka, K. Eguchi, and T. Nakagiri, Appl. Phys. Lett., 61, 3032 (1992).

H.J. Gao, K. Sohlberg, Z.Q. Xue, H.Y. Chen, S.M. Hou, L.P. Ma, X.W. Fang, X.W. Fang, S.J. Pang, and S.J. Pennycook, Phys. Rew. Lett. 84, 1780 (2000).

A. Bandyopadhyay and A.J. Pal, Appl. Phys. Lett. 82, 1215 (2003).

H.S. Majumdar, A. Bandyopadyay, A. Bolognesi, and A. J. Pal, J. Appl. Phys. 91, 2433 (2002).

D.M. Taylor and C.A. Mills, J. Appl. Phys. 90, 306 (2001).

Bachtold, Adrian et al., "Logic Circuits with Carbon Nanotube Transistors", *Science*, vol. 294, Nov. 9, 2001, pp. 1317-1320.

Duan, Xiangfeng et al., "Indium Phosphide Nanowires as Building Blocks for Nanoscale Electronic and Optoelectronic Devices", *Nature*, vol. 49, Jan. 4, 2001, pp. 66-69.

Gudiksen, Mark S. et al., "Growth of Nanowire Superlattice Structures for Nanoscale Photonics and Electronics", *Nature*, vol. 415, Feb. 7, 2002, pp. 617-620.

Adams, David M. et al., "Charge Transfer on the Nanoscale: Current Status", *J. Phys. Chem. B.*, 2003, vol. 107, No. 28, pp. 6668-6697.

Kamat, Prashant V. et al., "Electrochemical Modulation of Fluorophore Emission on a Nanostructured Gold Film", *Angew. Chem. Int.* Ed. 2002, vol. 41, No. 15, pp. 2764-2767.

Chen, Shaowei et al., "Gold Nanoelectrodes of Varied Size: Transition to Molecule-Like Charging", *Science*, vol. 280, Jun. 26, 1998, pp. 2098-2101.

Wuelfing, W. Peter et al., "Electronic Conductivity of Solid-State, Mixed-Valent, Monolayer-Protected Au Clusters", *J. Am. Chem. Soc.* 2000, vol. 122, No. 46, pp. 11465-11472.

Ouyang, Jianyong et al., "Programmable Polymer Thin Film and Non-Volatile Memory Device", *Nature Publishing Group, Nature Materials*, vol. 3, Dec. 2004, pp. 918-922.

Hostetler, Michael J. et al., "Alkanethiolate Gold Cluster Molecules with Core Diameters from 1.5 to 5.2 nm: Core and Monolayer Properties as a Function of Core Size", *Langmuir*, 1998, vol. 14, No. 1, pp. 17-30.

Ouyang, Jianyong et al., "Electric-Field-Induced Charge Transfer Between Gold Nanoparticle and Capping 2-Naphthalenethiol and Organic Memory Cells", *Applied Physics Letters*, 86, 2005, pp. 123507-1 to 123507-3.

Tang, C.W. et al., "Organic Electroluminescent Diodes", *Appl. Phys. Lett.* 51 (12), Sep. 21, 1987, p. 913-915.

Friend, R.H. et al., "Electroluminescence in Conjugated Polymers", *Nature*, vol. 397, Jan. 14, 1999, p. 121-128.

Sariciftci, N.S. et al., "Photoinduced Electron Transfer from a Conducting Polymer to Buckminsterfullerene", *Science*, vol. 258, Nov. 27, 1992, p. 1474-1476.

Gundlach, D.J. et al., "Pentacene Organic Thin-Film Transistors-Molecular Ordering and Mobility", *IEEE Electron Device Letters*, vol. 18, No. 3, Mar. 1977, p. 87-89.

Baldo, Marc et al., "Organic Vapor Phase Deposition", *Adv. Mater.* 1998, 10, No. 18, p. 1505-1514.

Carchano, H. et al., "Bistable Electrical Switching in Polymer Thin Films", *Applied Physics Letters*, vol. 19, No. 19, Nov. 15, 1971, p. 414-415.

Xu, W. et al., "Two New All-Organic Complexes with Electrical Bistable States", *Appl. Phys. Lett.* 67 (15), Oct. 9, 1995, p. 2241-2242.

Ma, L.P. et al., "Data Storage with 0.7 nm Recording Marks on a Crystalline Organic Thin Film by a Scanning Tunneling Microscope", *Applied Physics Letters*, vol. 73, No. 6, Aug. 10, 1998, p. 850-852.

Henisch, H.K. et al., "Switching in Organic Polymer Films" *Applied Physics Letters*, vol. 24, No. 12, Jun. 15, 1974, p. 589-591.

Bryce, Martin R., "Tetrathiafulvalenes as π-Electron Donors for Intramolecular Charge-Transfer Materials", *Advanced Materials*, 1999, 11, No. 1, p. 11-23.

Martin, Nazario et al., "Evidence for Two Separate One-electron Transfer Events in Excited Fulleropyrrolidine Dyads Containing Tetrathiafulvalene (TTF)", *J. Phys. Chem.* A 2000, 104, p. 4648-4657.

\* cited by examiner

NANOPARTICLE-POLYMER BISTABLE DEVICES

RELATED APPLICATION

This application claims the benefit of U.S. Provisional Application No. 60/573,304, filed May 20, 2004.

BACKGROUND OF THE INVENTION

1. Field of the Invention

The present invention relates generally to electronic memory cells and switches. More particularly, the present invention involves electrically bistable devices that utilize non-volatile memory elements including at least conducting nanofibers that could be doped with metal nanoparticles.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

In recent years, polymer and organic materials have drawn enormous attention in the application of electronic devices, such as light emitting diodes [1], photovoltaic cells [2], transistors [3] and non-volatile memory devices [4, 5]. Among these materials, polyaniline (PANI) is a conducting conjugated polymer, which has a large potential in electronic and chemical applications. The conductivity of PANI can be tuned by reversible acid/base doping/de-doping chemistry processes [6]. Recently, PANI has been made into one-dimensional nanostructures, such as nanowires, nanorods and nanofibers. The nanoscale network structure of PANI offers high interfacial area that is useful for providing chemical sensors with high selectivity and fast response time [7, 8]. However, these applications are still being explored and there is lack of useful polyaniline electronic devices.

SUMMARY OF THE INVENTION

In accordance with one embodiment of the present invention, electrically conducting nanofibers may be doped with electrically conducting nanoparticles to provide bistable memory devices. One way in which these memory devices have been successfully fabricated by utilizing solution processing with a polymer that also functions as an electrical insulator to prevent shorting out of the nanoparticles. The rewritable bistable memory effect arises from the nanoparticles, which are doped in or on the nanofibers. This phenomena provides a new field of use for nanoparticles and nanofiber materials, which when combined in accordance with the present invention will hopefully find wide-spread use in future electronic applications.

Bistable electrical devices in accordance with some embodiments of the present invention are convertible between a low resistance (ON) state and a high resistance (OFF) state by application of an appropriate writing or erasing voltage. These devices include a bistable polymer body that is electrically convertible between the low resistance state and the high resistance state. The bistable polymer body includes a first surface that defines a first electrode location and a second surface, which defines a second electrode location. The bistable polymer body is made up of an electrically insulating polymer material in which doped nanofibers are dispersed. The doped nanofibers include an electrically conductive nanofiber material, which makes up the nanofiber, and electrically conductive nanoparticles. The combination of the nanofibers and nanoparticles provides for a bistable polymer body that is converted between the low resistance state and the high resistance state by application of an electrical voltage to the bistable polymer body. The bistable electrical device further includes a first electrode attached to the bistable polymer body at the first electrode location and a second electrode attached to the bistable polymer body at the second electrode location.

The bistable devices in accordance with at least some embodiments of the present invention are well-suited for use as memory devices. In addition to the bistable devices, such memory devices include a memory input element for applying a voltage to the bistable polymer body to convert the bistable polymer body between the low electrical resistance state and the high electrical resistance state. The memory device also includes a memory readout element that provides an indication of whether the bistable polymer body is in the low electrical resistance state or the high electrical resistance state.

The above discussed and many other features and attendant advantages of the present invention will become better understood by reference to the following detailed description when taken in conjunction with the accompanying drawings.

DETAILED DESCRIPTION OF THE INVENTION

Figure 1:
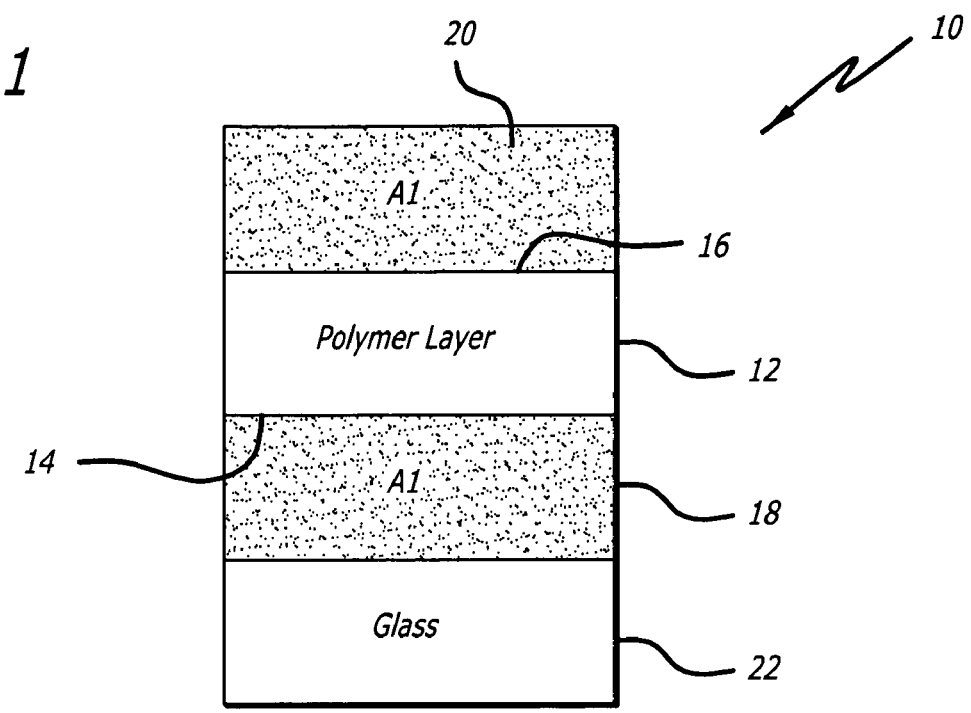
FIG. 1 is a diagrammatic representation of an exemplary bistable memory device embodiment in accordance with the present invention which is composed of a polymer layer having polyaniline (PANI) nanofibers that are doped with gold nanoparticles and embedded in a polyvinyl alcohol (PVA) matrix.

In accordance with one embodiment of the present invention, electrically conducting nanofibers (e.g. polyaniline) may be doped with electrically conducting nanoparticles (e.g. gold) to provide bistable memory devices. One way in which these memory devices have been successfully fabricated by utilizing solution processing with a water-soluble polymer that also functions as an electrical insulator to prevent shorting out of the nanoparticles. The rewritable bistable memory effect arises from the nanoparticles which are doped in or on the nanofibers. The high conductivity "ON" state can be switched on with a positive voltage pulse and erased with a higher negative bias back to low conductivity "OFF" state. The high/low conductivity ratio can reach $10^6$ for the first turn on. The device provides a stable $10^3$-ratio during following write-read-erase tests. The devices in accordance with the present invention can remain at either the ON or OFF state for a long period of time without significant degradation.

As a feature of another embodiment of the present invention, PANI nanofibers, which have been doped with gold (Au) nanoparticles, are mixed with water soluble poly vinyl-alcohol (PVA) and solution processed using standard procedures into non-volatile memory cells that demonstrate a rewritable bistable memory effect. This nanofiber-based device has a low resistance/high conductivity (ON) state that has an approximate 100 µA current when the device is read with 1V, for one example device embodiment. The ON state is recorded as "1". After the device is switched ON with 4 V, it can be erased with −5 V to provide a high resistance/low conductivity (OFF) state which has an approximate 0.01 µA when the device is read with 1 V. The OFF state is recorded as "0".

In accordance with the present invention, metal nanoparticle-doped electrically conducting nanofibers may be dispersed in a wide variety of insulating polymers to provide bistable polymer bodies that can be fabricated into a wide range of devices, such as memory devices. An exemplary bistable device embodiment is shown at 10 in FIG. 1. The device 10 includes a bistable polymer body or polymer layer 12, which is electrically convertible between a low resistance state and a high resistance state. The bistable polymer body includes a first surface 14, which defines a first electrode location and a second surface 16 which defines a second electrode location. The device 10 further includes a first electrode 18 that is attached to the bistable polymer body 12 at the first electrode location and a second electrode 20 that is attached to the bistable polymer body 12 at said second electrode location. As is conventional, the device is located on a substrate 22, which can be glass or other suitable substrate material.

The bistable polymer body 12 is composed of an electrically insulating polymer material in which doped nanofibers are dispersed. The electrically insulating polymer can be any compatible polymer matrix material, such as polyvinyl alcohol (PVA), polyvinyl chloride, poly-methyl methacrylate (PMMA), polystyrene, cross-linked poly-4-vinylphenol (PVP), polyethylene oxide, poly(N-ethyl-2-vinylcarbazole) (PVK), polyesters, polyester ketone, polyimide, polyurethane, polychlorotrifluoroethylene, which functions as an insulating matrix in which the doped nanofibers are dispersed. PVA is a preferred electrically insulating polymer material. It may be doped with a variety of materials, if desired, to change its electrical properties. For example, it can be doped by various types of acids, such as camphorsulfonic acid (CSA), HCl, $H_2SO_4$, $HNO_3$, $HClO_4$, amino acids, succinic acid, and mercapto-succinic acid.

The electrically insulating polymer material functions as a "filler" material to prevent shorting out of the device. Accordingly, any inert polymer material may be used. However, it should be noted that materials with different dielectric constants might behave differently, since high dielectric constant polymers respond more to an applied electric field. Accordingly, the "filler" may not only function as an inert material that separates the nanoparticles and nanofibers, but may also be used to vary the electrical properties of the device.

The doped nanofibers can be made from a number of suitable electrically conductive nanofiber materials on which electrically conductive nanoparticles can be deposited. Polyaniline is the preferred nanofiber material. However, many other conductive nanofiber materials may be used, such as sulfonated polystyrene polyaniline, polythiophene, poly (3-hexythiophene) polyfluorene, poly[2-methoxy-5-(2-ethyl-hexyoxy)-1,4-phenylene vinylene] (MEH-PPV), polypyrrole, polyurethane, poly(vinylpyrrolidine). Of course, other conductive nanofiber materials can be used, both existing and yet to be developed. Electrically conductive conjugated polymers ("electronic polymers") may be used provided that they have some pi-electrons. It is preferred that the electrically conductive polymer be in the form of a nanofiber. However, nanoparticles that are connected to individual polymer molecules are also contemplated.

Gold is the preferred metal for the conductive nanoparticles. Many metals, such as titanium, palladium, silver, platinum and copper, and the like, may also be used. The nanoparticles may also be non-metallic provided that the density of states is high enough. CdTe, CdSe, CdS, ZnS, GaN, $Ag_2S$, $CuS_2$, CuTe, CuSe are just a few examples. The electrodes may be made from any of the common electrode materials including aluminum, titanium, palladium, gold, silver, copper and calcium. As before, many other nanoparticles and electrode materials, both existing and yet to be developed can be used.

The bistable polymer body may be made by suspending an appropriate amount of nanoparticle-doped nanofibers in a solution of the insulating polymer in one embodiment. This solution of dispersed doped nanofibers is then spin-cast onto the electrode using well-known spin casting techniques. The amount of doped nanofibers in the insulating polymer solution can be varied widely depending upon various parameters, including nanofiber material, nanofiber size, the type/size of nanoparticles and the level of nanoparticle doping.

The fabrication of the conducting nanofibers and subsequent doping with the conducting nanoparticles may be accomplished using known methods for fabricating nanofibers and doping nanoparticles on or in the nanofibers. For example, the synthesis process for suitable PANI nanofibers is using the known polymerization method at the interface of aniline dissolved in organic solvent and ammonium peroxydisulfate dissolved in water with camphorsulfonic acid [9]. The resulting twisted network structure of PANI nanofibers with diameters tunable from 10 to 180 nm was suspended in water, but cannot be dissolved in organic solvent, when the deionized water bath reaches a pH value of 7. Furthermore, the PANI was used as template to grow AuNPs on the fiber by adding chloroauric acid ($HAuCl_4$) at the temperature above the melting point of the solvent. For example, in aqueous solution the temperature is adjusted between 0 to 15° C. By controlling the temperature and synthesis times, different sizes of nanoparticles (ranging from 0.5 to 15 nanometers) can be made. The solution is later transferred into a dialysis bag in ammonium aqueous solution to de-dope and purify until a pH value of 7 is reached. The color changes from green to black after the AuNPs are doped onto the polyaniline nanofiber. The 0.01 to 5 wt % PANI nanofiber decorated with nanoparticles suspended in water was blended with a host 0.5 to 7 wt % PVA in order to get a uniform spin coating film of 30 nm to 200 nm. The device fabrication can be constructed by sandwiching the spin coated PANI layer (bistable polymer body) by two aluminum electrodes or casting the polymer solution directly onto the electrode. Of course, other methods of fabricating these devices can be used.

In one exemplary embodiment, the bottom (first) and top (second) electrodes were both coated (80 nm thick) onto the bistable polymer body by thermal evaporation under the background pressure of smaller than $5 \times 10^{-6}$ torr. In another embodiment, using the shadow mask technique during evaporation, the bottom Al was formed on a glass substrate and patterned into parallel columns with a width of 0.5 mm and a separation of 3 mm. The bistable polymer layer was then spin coated on the glass substrate with the column type Al electrodes. The device was completed with the deposition of top Al layer as the top electrode. The overlap area (0.25 $mm^2$) between bottom and top Al was defined as the dimension of PANI device.

The thickness of metal and polymer film was characterized by quartz crystal monitor and Dektak profilometer, respectively. The measurement of electrical properties was conducted in vacuum of $1 \times 10^{-4}$ torr. I-V characteristics were obtained with an HP 4155A semiconductor parameter analyzer. The write-read-erase cycle tests were measured with programmable Keithley 2400 power supply and Labview software.

Figure 2:
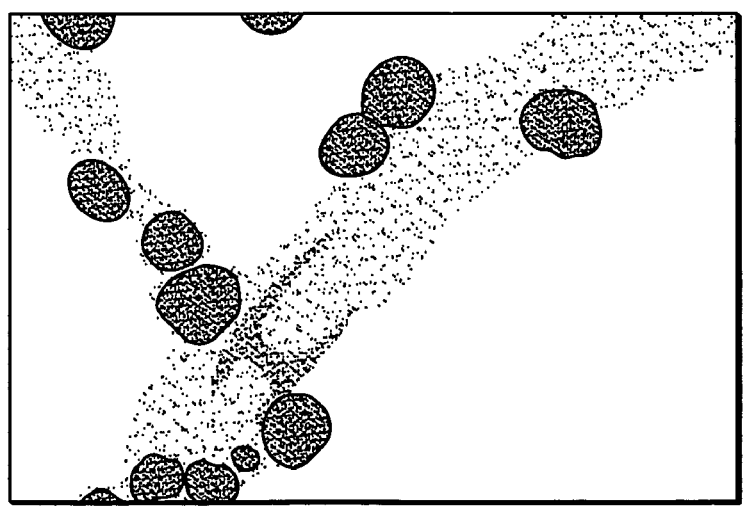
FIG. 2 depicts a tunneling electron microscopic (TEM) image of PANI nanofibers doped with gold nanoparticles (AuNPs).

The device structure for the above example embodiment is shown in FIG. 1. The AuNPs doped PANI nanofibers were checked with transmission electron microscopy (TEM, JEOL 100CX). The PANI nanofiber with a diameter of 20 to 40 nm and AuNPs size of 15-25 nm were observed as shown in FIG. 2. The length of the nanofiber is about 500 nm and has a twisted structure combined with several fibers. In some cases, the sizes of AuNPs are comparable to the diameter of PANI nanofibers. In general, the nanofibers will range in size form 3 to 120 nm with the nanoparticles having a corresponding size range. It is believed that the bistable electrical transition is due to charge transfer between the nanoparticles and the nanofibers. Accordingly, the effect will depend to some degree on the density of the nanoparticles. The density of nanoparticles shown in FIG. 2 is only exemplary. The density (level of doping) may be varied to some extent from what is shown in FIG. 2 provided that the bistable electrical effect is not lost. The level of doping depends on the size of nanoparticles and density of nanoparticles in the nanofibers. The sizes may range from 0.5 to 15 nm. The density of nanoparticles doped in nanofibers ranges from 10 to 70 volume %.

Figure 3:
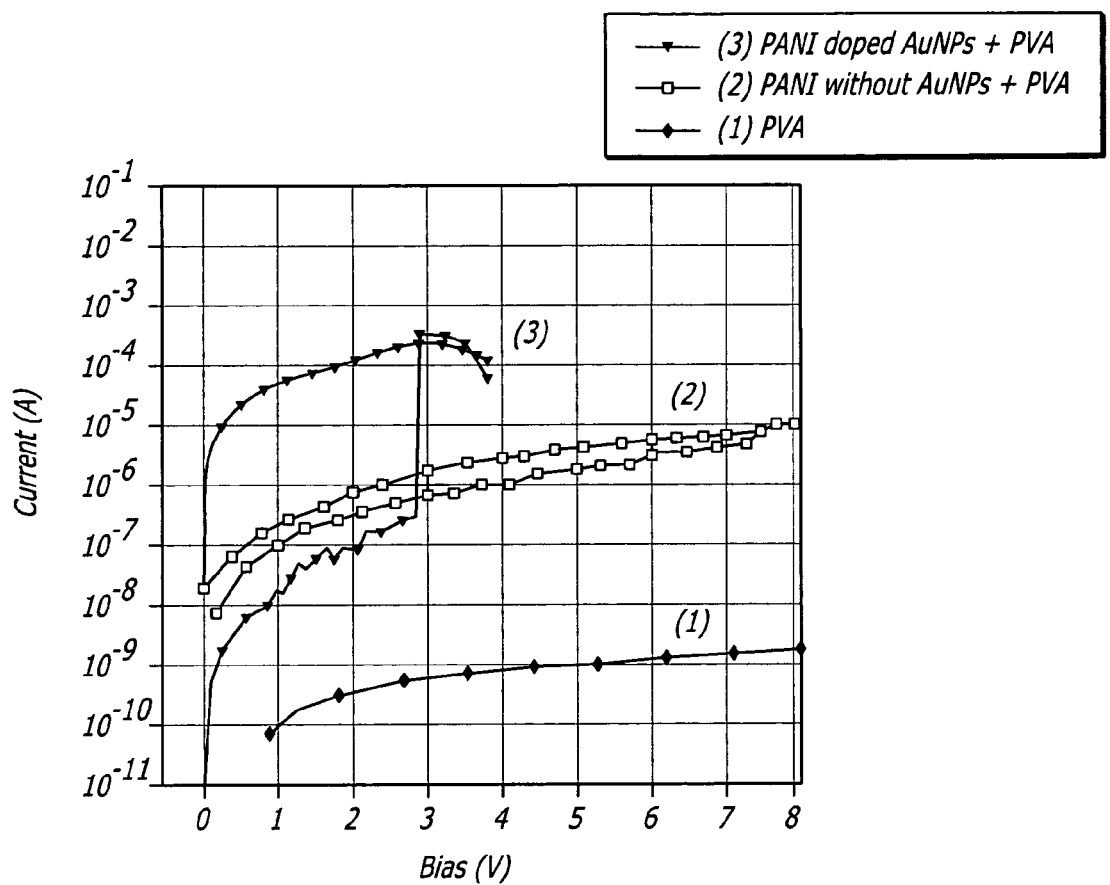
FIG. 3 is a graphic comparison showing the I-V characteristics of three different devices, one of which is an embodiment of the present invention.

FIG. 3 shows a comparison of the I-V behavior of 3 different devices. (Curve (1) is a device similar to FIG. 1, except that the polymer layer is composed only of PVA. Curve (2) is a device similar to FIG. 1 except that the polymer layer is composed of non-doped PANI nanofibers that are blended with PVA. Curve (3) is a device in accordance with FIG. 1 where the polymer layer is composed of the AuNP-doped PANI nanofibers blended with PVA. Bias was scanned from 0 to 8V for the curve (1) and (2) devices. The Curve (3) device in accordance with the present invention was scanned from 0 to 4 V and then scanned by a subsequent 4 to 0 V.) The first device with only a PVA layer, remains at low current state of $10^{-9}$ A at 8 V bias and does not change much or appear breakdown even at higher bias of 30 V. The PVA layer exhibits good insulating property and shows no bistability or memory effect. For the second device, with PANI nanofibers in a PVA matrix without doping with AuNPs, The current gradually increases from $10^{-8}$ to $10^{-5}$ A with an increasing bias scan from 0 to 8 V. The device does not show any sudden jump or drop of current while biased to a high voltage of 22 V. This demonstrates that the bistable memory effect does not result from the PANI nanofiber alone. The conductivity of PANI is about 3 orders larger than PNAT. True bistability I-V is provided by the combination of AuNPs and PANI nanofibers in accordance with the present invention, as indicated by curve (3).

The PVA/PANI nanofiber/Au nanoparticle device embodiment shown in FIG. 1/2 was biased from 0 to 4 V, and followed with a subsequent 4 to 0 V scan. There is an abrupt current jump around 3 V from low conductivity state to high conductivity state with a 3 order of magnitude differences. During the reverse 4 to 0 V scan, the current remains at high conductivity state and slightly decreases in the order $10^{-5}$ A, along with a rapid drop to $10^{-8}$ A around 0.1 V. Three orders differences in conductivity at the same bias features is considered to be the so called bistability memory effect, which can be used as non-volatile memory cell. If the device was read using 1V, "0" or "1" states are distinguished from a low conductivity (OFF) state, and a high conductivity (ON) state, respectively.

Figure 4:
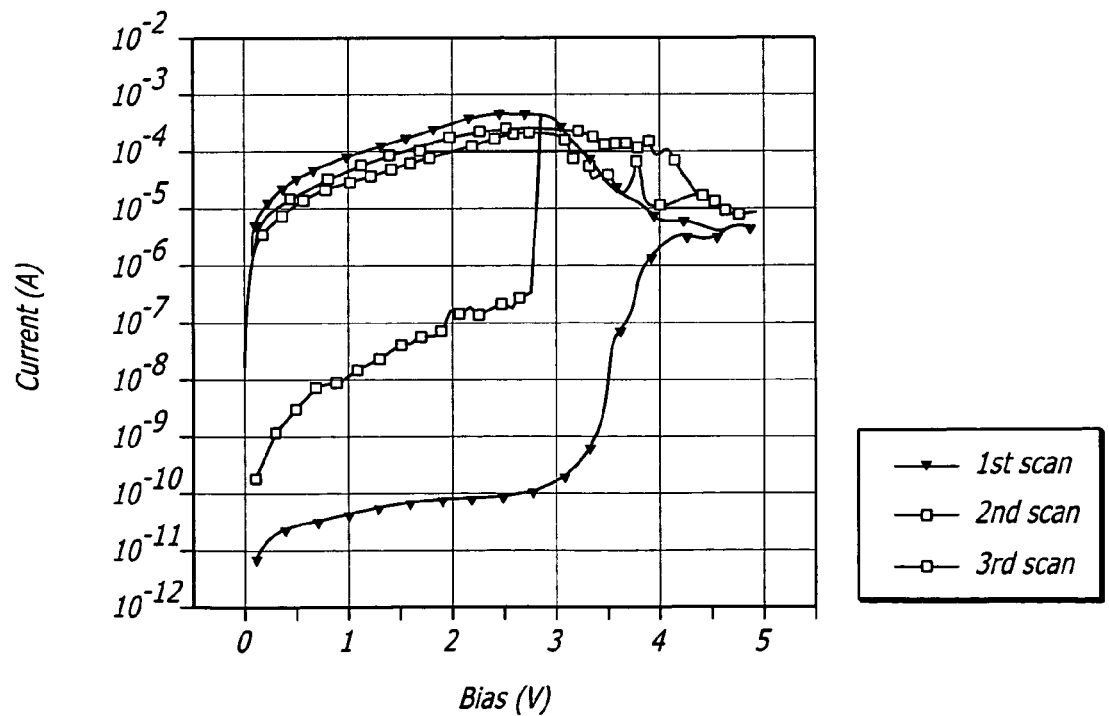
FIG. 4 is a graph showing the I-V characteristics of an exemplary AuNP-doped PANI nanofiber device in accordance with an embodiment of the present invention.

Further detail I-V properties of exemplary device embodiments using AuNPs doped PANI nanofibers in a PVA matrix are presented in FIG. 4. Typical I-V characteristics of bistable devices are demonstrated by applying a voltage loop from 0 V to a high voltage, for instance 5 V, and followed by 5 to 0 V immediately. During the 1 st scan, the device shows a relatively low current of about $10^{-10}$ A up to 3.4V, where the current is mainly limited by the insulating material of PVA as the same order of current state confirmed by curve (1) in FIG. 3. Moreover, the current abruptly increases 4 orders of magnitude to $10^{-6}$ A around 3.4 V. This voltage is referred to as the turn on bias, and causes saturates to a current of around $10^{-5}$ A from approximately 4V to approximately 5 V in this embodiment. This I-V sweep indicates the transition from the low conductivity/high resistance (OFF) state to high conductivity/low resistance (ON) state. In the later half loop scan from 5 to 0 V, the device current increases from $10^{-5}$ to $5\times10^{-4}$ A, while scanning from 5 to 3 V, where there is a negative differential resistance (NDR) region. From 3 to 0 V the current maintains at the "ON" state with a decrease from $5\times10^{-4}$ to $5\times10^{-6}$ A, showing a positive differential resistance (PDR) region. The second scan provides us the information of stability using the same scan loop from 0 to 5 V and 5 to 0 V, continuously. The current follows the previous "ON" state curve, which has a PDR region between 0 to 3 V and NDR region between 3 to 5 V. Therefore, the device embodiment was verified at the "ON" state, and the stability is quite reliable, although it goes through the NDR region from 3 to 5 V.

After the second scan, a single pulse of around −5 V, located at the NDR region, was applied to switch the device back to "OFF" state. The third scan, from 0 to 4 V and 4 to 0 V, was later established to show the device being able to turn on again, and is rewritable. The current at "OFF" state was found to be 2 to 3 orders larger than first scan, in which suggests the conductivity is limited by higher conductivity species, i.e. PANI. The "OFF" state current of $10^{-9}$~$10^{-7}$ A is about the same order of PANI without AuNPs as observed from curve (2) in FIG. 3. The turn on bias is about 2.8 V, and the "ON" state current is the same as first and second scan.

The exemplary AuNPs doped PANI nanofiber device embodiment shows some extraordinary performance over and above other organic molecule memory devices. First, the device at the low conductivity "OFF" state can be turned on to high conductivity "ON" state with a pulse of 4 V along with a width of 15 nanoseconds using a pulse generator (HP 214B Pulse Generator). The observed nanosecond response time (approximately 15 ns) is surprising since the transition time of ferroelectric polymer [10] and other organic bistable materials are at the microsecond range or even slower. The nanosecond transition time indicates that the switching mechanism may be due to electronic process rather than chemical arrangement, conformational change, or isomerization [11] observed in other devices.

Figure 5:
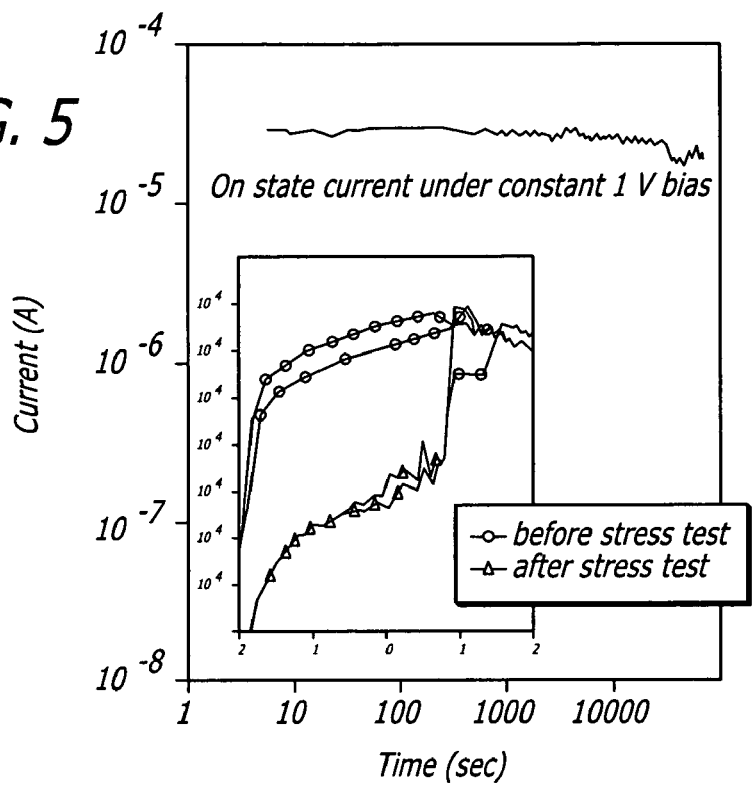
FIG. 5 is a graph showing an exemplary stability test of the "ON" state current when an exemplary device embodiment was biased at a constant 1 V over 5 sec intervals. The inset shows the I-V curves before and after the stress test.

Second, the device embodiment shows excellent stable bistability, the data of which can be stored at "ON" state for a long period of time without losing the data. The "ON" state current was measured by biasing a constant 1 V stress test with an interval of 5 sec, as shown in FIG. 5. The retention time of "ON" state signal approaches $5\times10^4$ sec without significant degradation, more stable than the bistable molecule memory cell with a 900 sec retention time [12]. In addition, the inset shows the same bistability loop before and after the stress test.

Figure 6:
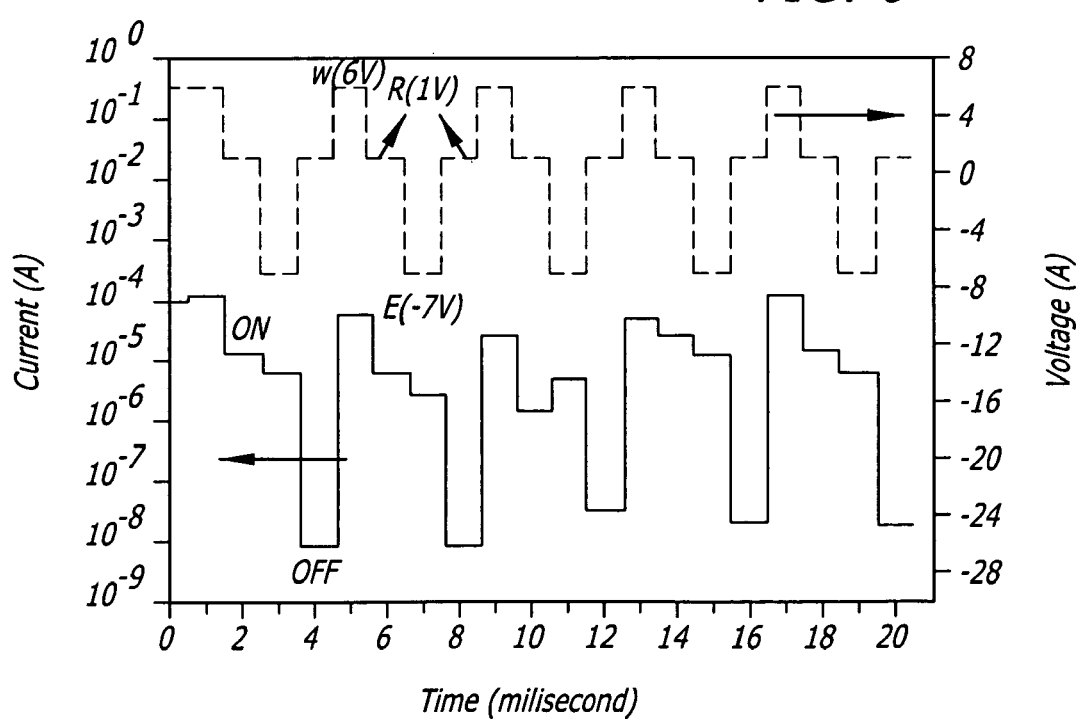
FIG. 6 is a graph showing the current response of an exemplary AuNP-doped PANI nanofiber device embodiment during the write-erase-read testing cycles.

Third, FIG. 6 demonstrates the cycle test, which shows how the exemplary device embodiment was programmed to write, read, and erase. A voltage of 6V was applied to turn the device to "ON" state. The current of "ON" state being read through 1V bias was about $10^{-5}$ A. The "ON" state can be erased by a voltage of −7 V, and switched the device to "OFF" state with a current of $10^{-8}$ A. One should be able to reach about $10^6$ switching cycles, comparable to flash memory, due to the stable "ON" state and nanosecond switching time. The device on/off ratio maintaining at $10^{2-3}$ is much more stable than the molecule with large on/off ratio variation from 1 to $10^4$ [13]. Therefore, in regards to the better performance over other molecule bistable materials, the programmable AuNPs doped PANI nanofiber memory cell in accordance with the present invention can be used as a promising non-volatile memory device.

The role played by the materials of at least some of the AuNPs doped PANI nanofiber device embodiments can be summarized as follows. The rewritable behavior is due to the effect from AuNPs, and the charge transport between AuNPs and PANI. The device of PANI nanofiber without doping AuNPs does not present the bistable effect. The "OFF" state current is limited by the conductivity of PANI. The PVA serves as host and insulating material to provide finely dispersed PANI nanofiber in the polymer film. The bistable polymer body provided by the present invention may be used as the bistable body in devices such as those disclosed in PCT US01/399,586.

There are several advantages of the polymer memory device embodiments of the present invention. First, they can be solution processed, providing inexpensive process and fabrication costs and high density with layer-by-layer spin coating deposition. Most importantly, the nanoparticle doped PANI nanofiber materials exhibit a rewritable bistability effect with high speed and good stability. In addition, this fiber type structure provides for an easy integration of nanofibers into any flexible matrix to provide novel electronic products, such as digital clothes, and electronic books.

Other device embodiments of the present invention can be easily expanded into other polymer systems and nano-particles (or even organic molecules which have the right electronic energy structure) as long as they form a charge transfer system that provides the necessary bistable behavior. Depending on the barrier between the donor-acceptor, the memory device can be a re-writeable, nonvolatile memory device, or it can be a write once and read many times device. As such, a number of device embodiments having different read and write behaviors can be appreciated. The role of PVA in the bistable device is as a filler material to prevent electrical short circuits. However, if desired, the PVA polymer can add advantageous functionality to device embodiments, such as light-emitting, light-harvesting, chemical sensing, and charge transport. Hence, the above-described exemplary device embodiment, although described in connection with a memory format, this it not a limitation since device embodiments can be expanded into other electronic devices, like switch, nonvolatile light-emitting device, sensors, and the like.

The bistable devices may be fabricated into nanoscale high-density memory arrays. In order to function as a memory device embodiment, the exemplary bistable device described above requires a memory input element for applying a voltage to the bistable polymer body to convert the bistable polymer body between the low electrical resistance state and the high electrical resistance state. In addition, a memory readout element is required, which provides an indication of whether the bistable polymer body is in the low electrical resistance state or said high electrical resistance state. These elements are well-known to those of ordinary skill in the art.

Figure 7:
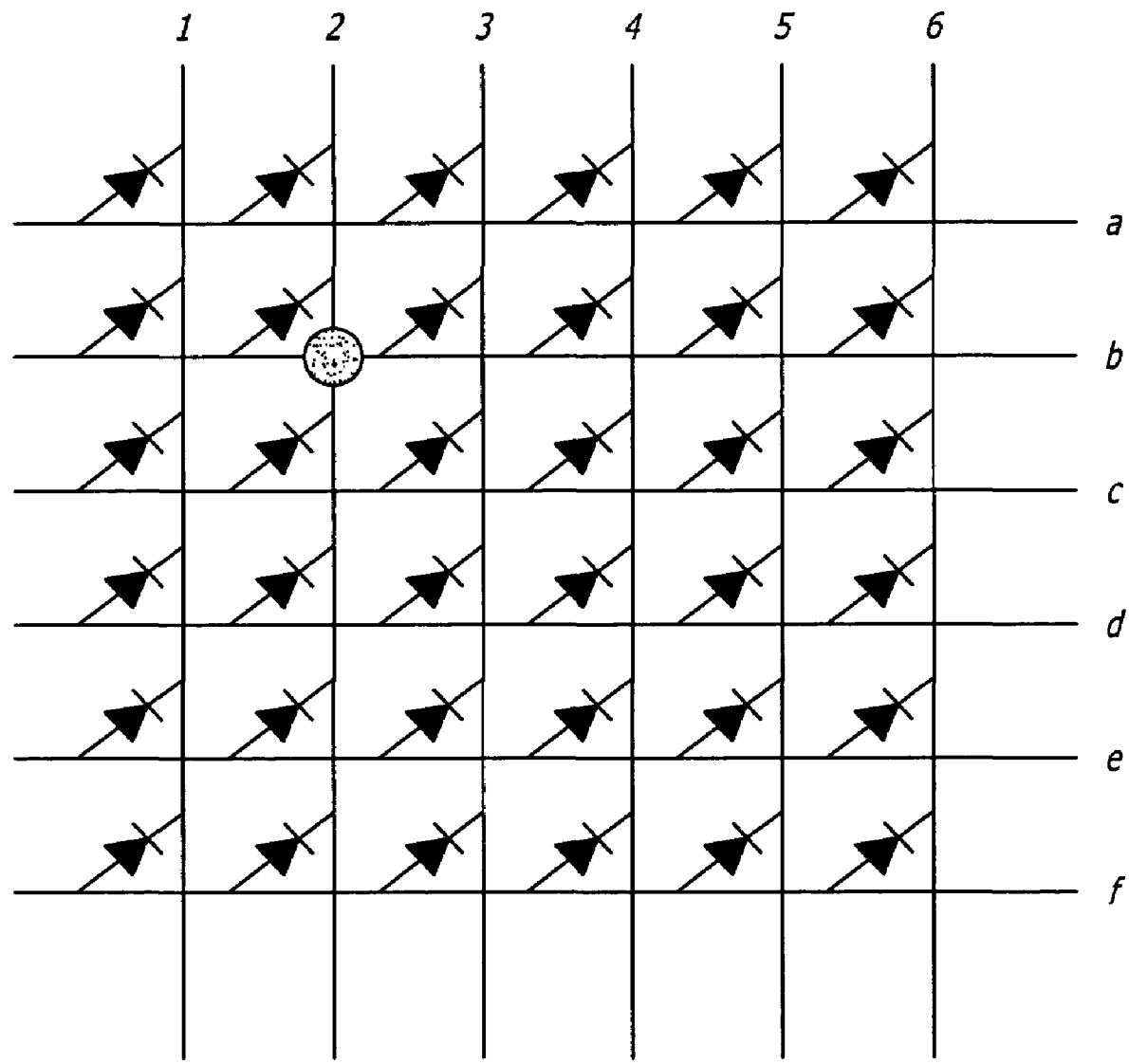
FIG. 7 is a schematic representation of an exemplary cross-bar memory circuit according to one embodiment of the present invention.

An exemplary nanoscale memory device embodiment is formed in the cross-bar configuration as shown in FIG. 7. Preferably, a diode will be also attached to the memory cell to prevent cross-talk. A 6×6 version of the cross-point memory is shown in FIG. 7. The structure consists of two sets of overlapping nanowires. Sandwiched between the wires are electrically addressable the bistable polymer switches in accordance with the present invention. When a switch is closed, the resistance between connecting wires is low, and this constitutes a '1'. When the switch is opened, the resistance is high, and a '0' is stored. This network of two-terminal devices based on an array of hysteretic switches is similar in function to the Magnetic Random Access Memory but the density of the circuits will be significantly higher. A crossbar has several advantages: First, the wire dimensions can be scaled continuously down to fabrication limited sizes, while the number of wires in the crossbar can be scaled up arbitrarily to form large-scale generic circuits that can be configured for memory and/or logic applications. Second, it is a reconfigurable architecture that can tolerate defective elements generated during the nanofabrication process. Third, the simple physical structure of the crossbar makes nanoscale fabrication feasible and potentially inexpensive.

The exemplary nanoscale crossbar circuit embodiment brings the promise of building circuits with enormous densities and device counts. To write a bit in the circuit, an analytic voltage +V is required to set a bit to a 1 at a cross-point. Select one vertical nanowire to have a voltage of +V/2 and one horizontal nanowire to have a voltage −V/2, while forcing all other horizontal and vertical wires to zero volts potential. Then exactly one bit has a voltage of +V across it. N−1 bits in the selected column have +V/2 across them and N−1 bits in the selected row have −V/2 across them. All other $(N-1)^2$ bits have zero volts across them. All unselected bits have a large (at least V/2) safety margin against being accidentally written, which is determined by the analytical switching voltage. It should be noted that the cross point memory cell shown in FIG. 7 cannot be a simple switch. To make a scalable memory circuit, one must use diodes in series with a switch at each cross-point.

Having thus described exemplary embodiments of the present invention, it should be noted by those skilled in the art that the within disclosures are exemplary only and that various other alternatives, adaptations, combinations, and modifications may be made within the number or device embodiments within the scope of the present invention.

BIBLIOGRAPHY

[1] Burroughes, J. H., Bradley, D. D. C., Brown, A. R., Marks, R. N., Mackay, K., Friend, R. H., Burns, P. L. & Holmes, A. B. Light-emitting diodes based on conjugated polymers. *Nature* 347, 539-541 (1990).

[2] Wendy U. Huynh, Janke J. Dittmer, A Paul Alivisatos, Science, 295, 2425 (2002).

[3] S. Scheinert, G. Paasch, M. Schrodner, H. K. Roth, S. Sensfub, and Th. Doll, J. Appl. Phys., 92, 300 (2002).

[4] L. Ma, J. Liu, Y. Yang, Appl. Phys. Lett., 80, 2997 (2002). "Organic electrical bistable devices and rewritable memory cells".

[5] L. Ma, S. Pyo, J. Ouyang, Q. Xu, Y. Yang, Appl. Phys. Lett., 82, 1419 (2003). "Nonvolatile electrical bistability of organic/metal-nanocluster/organic system."

[6] J. C. Chiang, A. G. MacDiarmid, Synth. Met., 13, 193 (1986). "Polyaniline: Protonic acid doping of the emeraldine form to the metallic regime."

[7] Jiaxing Huang, Shabnam Virji, Bruce H. Weiller, and Richard B. Kaner, J. Am. Chem. Soc., 25, 314 (2003). "Polianiline ANanoflibers: Facile Synthesis and Chemical Sensors."

[8] Shabnam Virji, Jiaxing Huang, Richard B. Kaner, and Bruce H. Weiller, Nano Lett., 4, 491 (2004). "Pollyaniline Nanofiber Gas Sensors: Examiner of Response Mechanisms".

[9] Jiaxing Huang, and Richard B. Kaner, J. Am. Chem. Soc., 126, 851 (2004). "A General Chemical Route to Polyaniline Nanofibers".

[10] T. Furukawa, Adv. Colloid Interface Sci., 71-72, 183 (1997). "Structure and functional properties of ferroelectric polymer."

[11] Tsuyoshi Tsujioka and Kazuya Masuda, Appl. Phys. Lett., 83, 4978 (2003). "Electrical carrier-injection and transport characteristics of photochromic diarylethene films".

[12] M. A. Reed, J. Chen, A. M. Rawlett, D. W. Price, and J. M. Tour, Appl. Phys. Lett, 78,3735 (2001). "Molecular random access memory cell".

[13] Yong Chen, Douglas A. A. Ohlberg, Xuema Li, Duncan R. Stewart, R. Stanley Williams, Jan O. Jeppesen, Kent A. Nielsen, J. Fraser Stoddart, Deirdre L. Olynick, Erik Anderson, Appl. Phys. Lett. 82, 1610 (2003). "Nanoscale molecular-switch devices fabricated by imprint lithography".

What is claimed is:

1. A bistable electrical device that is convertible between a low resistance state and a high resistance state, said device comprising:
    a bistable polymer body which is electrically convertible between said low resistance state and said high resistance state, said bistable polymer body comprising a first surface which defines a first electrode location and a second surface which defines a second electrode location, said bistable polymer body comprising an electrically insulating polymer material in which doped nanofibers are dispersed, said doped nanofibers comprising electrically conductive nanoparticles doped at least one of on or in nanofibers wherein said bistable polymer body is converted between said low resistance state and said high resistance state by application of an electrical voltage to said bistable polymer body;
    a first electrode attached to said bistable polymer body at said first electrode location; and
    a second electrode attached to said bistable polymer body at said second electrode location,
    wherein each of said nanofibers has a width and a length, said length being longer than said width, and
    wherein said width is at least 3 nm and less than 120 nm.

2. A bistable electrical device according to claim 1 wherein said electrically insulating polymer is selected from the group consisting of polyvinyl alcohol, polyvinyl chloride, polymethyl methacrylate, polystyrene, cross-linked poly-4-vinylphenol, polyethylene oxide, poly(N-ethyl-2-vinylcarbazole) (PVK), polyesters, polyester ketone, polyimide, polyurethane, polychlorotrifluoroethylene, and combinations thereof.

3. A bistable electrical device according to claim 2 wherein said electrically insulating polymer is polyvinyl alcohol, said electrically conductive nanofiber material is polyaniline and said nanoparticles are gold, titanium, palladium, silver, platinum, copper, and combinations thereof.

4. A bistable electrical device according to claim 1 wherein said electrically conductive nanofiber material is selected from the group consisting of polyaniline, sulfonated polystyrene polyaniline, polythiophene, poly (3-hexythiophene) polyfluorene, poly[2-methoxy-5-(ethyl-hexyoxy)-1,4-phenylene vinylene], polypyrrole, polyurethane, poly(vinylpyrrolidine), and combinations thereof.

5. A bistable electrical device according to claim 1 wherein said nanoparticles are selected from the group consisting of gold, titanium, palladium, silver, platinum, copper and combinations thereof.

6. A method comprising the step of applying a sufficient electrical voltage across the first and second electrodes of the bistable device according to claim 1 to convert said device between said high resistance state and low resistance state.

7. A memory device comprising:
    a bistable polymer body which is electrically convertible between said low resistance state and said high resistance state, said bistable polymer body comprising a first surface which defines a first electrode location and a second surface which defines a second electrode location, said bistable polymer body comprising an electrically insulating polymer material in which doped nanofibers are dispersed, said doped nanofibers comprising electrically conductive nanoparticles doped at least one of on or in nanofibers wherein said bistable polymer body is converted between said low resistance state and said high resistance state by application of an electrical voltage to said bistable polymer body;
    a first electrode attached to said bistable polymer body at said first electrode location;
    a second electrode attached to said bistable polymer body at said second electrode location;
    a memory input element for applying a voltage to said bistable polymer body to convert said bistable polymer body between said low electrical resistance state and said high electrical resistance state; and
    a memory readout element which provides an indication of whether said bistable polymer body is in said low electrical resistance state or said high electrical resistance state,
    wherein each of said nanofibers has a width and a length, said length being longer than said width, and
    wherein said width is at least 3 nm and less than 120 nm.

8. A memory device according to claim 7 wherein said electrically insulating polymer is selected from the group consisting of polyvinyl alcohol, polyvinyl chloride, polymethyl methacrylate, polystyrene, cross-linked poly-4-vinylphenol, polyethylene oxide, poly(N-ethyl-2-vinylcarbazole) (PVK), polyesters, polyester ketone, polyimide, polyurethane, polychlorotrifluoroethylene and combinations thereof.

9. A memory device according to claim 8 wherein said electrically insulating polymer is polyvinyl alcohol, said electrically conductive nanofiber material is polyaniline, and said nanoparticles are gold.

10. A memory device according to claim 7 wherein said electrically conductive nanofiber material is selected from the group consisting of polyaniline, sulfonated polystyrene polyaniline, polythiophene, poly (3-hexythiophene) polyfluorene, poly[2-methoxy-5-(2-ethyl-hexyoxy)-1,4-phenylene vinylene, polypyrrole, polyurethane, poly(vinylpyrrolidine) and combinations thereof.

11. A memory device according to claim 7 wherein said nanoparticles are selected from the group consisting of gold, titanium, palladium, silver, platinum, copper and combinations thereof.

* * * * *